US008462540B2

(12) United States Patent
Chang et al.

(10) Patent No.: US 8,462,540 B2
(45) Date of Patent: Jun. 11, 2013

(54) STATIC RANDOM ACCESS MEMORY CELL

(75) Inventors: Meng-Fan Chang, Taichung (TW); Lai-Fu Chen, Zhunan Township (TW); Jui-Jen Wu, Zhubei (TW); Hiroyuki Yamauchi, Fukuoka (JP)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 13/284,532

(22) Filed: Oct. 28, 2011

(65) Prior Publication Data

US 2013/0107609 A1 May 2, 2013

(51) Int. Cl.
*G11C 11/412* (2006.01)

(52) U.S. Cl.
USPC .......................................................... 365/154

(58) Field of Classification Search
None
See application file for complete search history.

(56) References Cited

U.S. PATENT DOCUMENTS

2009/0161410 A1* 6/2009 Houston ....................... 365/154
2010/0124099 A1* 5/2010 Wu et al. ....................... 365/154

* cited by examiner

*Primary Examiner* — Hoai V Ho
*Assistant Examiner* — James G Norman
(74) *Attorney, Agent, or Firm* — Wang Law Firm, Inc.; Li K. Wang; Stephen Hsu

(57) ABSTRACT

A static random access memory cell comprising a first inverter, a second inverter, a first transistor, a second transistor, and a third transistor. The first inverter is cross-coupled with the second inverter. The first transistor is connected with a write word line, a write bit line, and a first output node of the first inverter. The second transistor is connected with a complementary write bit line, the write word line, and a second output node of the second inverter. The third transistor is connected with a read bit line, a read word line, and the first input node of the first inverter to form a read port transistor, and a read port is formed. The read port transistor has a feature of asymmetric threshold voltage, and the read bit line swing can be expanded by the decrease of clamping current or the boosted read bit line.

15 Claims, 4 Drawing Sheets

STATIC RANDOM ACCESS MEMORY CELL

BACKGROUND OF THE INVENTION

1. Field of the Invention

The present invention relates to a semiconductor memory cell, in particular to a static random access memory cell (SRAM cell) formed by coupling seven transistors.

2. Description of the Related Art

Static random access memory (SRAM) has the advantages of quick access and low power consumption, and thus the SRAM is used extensively in electronic products including notebook computers, mobile devices and game players.

Wherein, a conventional static access memory cell with a six-transistor (6T) structure is formed by six metal oxide semiconductor field effect transistors (MOSFET) coupled to one another. With reference to FIG. 1 for a schematic view of a conventional six-transistor SRAM cell, the six-transistor SRAM cell (6T-SRAM Cell) 1 comprises a first inverter 11, a second inverter 12, a first transistor 13 and a second transistor 14. The first inverter 11 and the second inverter 12 are formed by cross-coupling a p-type metal oxide semiconductor (P-MOS) and an n-type metal oxide semiconductor (N-MOS) respectively, and a first input node 111 of the first inverter 11 is coupled to a second output node 122 of the second inverter 12, and a first output node 112 of the first inverter 11 is coupled to a second input node 121 of the second inverter 12 to form a latch circuit. The latch circuit is coupled between a power source and the ground, and the first output node 112 and the second output node 122 are two storage nodes of the memory cell respectively.

A gate of the first transistor 13 and a gate of the second transistor 14 are jointly coupled to a word line 100. A drain of the first transistor 13 and a drain of the second transistor 14 are coupled to the first output node 112 and the second output node 122 respectively. A source of the first transistor 13 and a source of the second transistor 14 are coupled to a pair of complementary bit lines 101 and 102 respectively. When the word line 100 is switched to a high voltage level of the memory cell, the first transistor 13 and the second transistor 14 are conducted to form a pass gate for controlling an operation of reading or writing data in the memory cell, and allowing the pair of complementary bit lines 101 and 102 to access the storage nodes. When the word line 100 is switched to a low voltage level of the memory cell, the first transistor 13 and the second transistor 14 are cut off, and the pair of complementary bit lines 101 and 102 are disconnected from the storage nodes, and no memory data can be accessed.

The conventional six-transistor SRAM cell adopts one word line to read and write data. When the memory cell is accessed, the pass gates of adjacent unselected memory cells are weakly turned on. As a result, the current is leaked, and data of adjacent unselected memory cells may be turned over in a serious case, and this phenomenon is called "half-selected disturb". In addition, during the reading process, the pass gate of the memory cell is turned on, a data voltage in the memory cell rises or drops slightly, and the data in the memory cells may be turned over in a serious case, and this phenomenon is called "read disturb".

To overcome the aforementioned problems, related manufacturers and designers provided an eight-transistor static random access memory cell (8T-SRAM Cell) formed by connecting six transistors in series with two transistors and adding another read word line and a pair of complementary read bit lines. The two serially connected transistors are provided for reading and writing data in the memory cell by different word lines and bit lines to eliminate the read disturb occurred when reading data in the memory cell and the half-selected disturb of the adjacent memory cells.

However, the eight-transistor static random access memory cell achieves the effect of having independent read port and write port by means of the additional two pass gates, the pair of complementary read bit lines and a read word line, so that the integrated circuit design of the eight-transistor static random access memory cell incurs a higher complexity, an increased unit area and a higher power consumption. In addition, the swing amplitude of the read bit line may be restricted by the data of the memory cells, so that the eight-transistor static random access memory cell may have a lower sensing margin, a lower read stability, a higher operation voltage and a higher power consumption.

SUMMARY OF THE INVENTION

In view of the problems of the prior art, it is a primary objective of the present invention to provide a SRAM cell formed by coupling seven transistors with one another, so that the memory cell has independent read port and write port and can eliminate the read disturb and the half-selected disturb of the adjacent memory cells when memory data are read from the six-transistor static random access memory. In addition, the feature of an asymmetric threshold voltage of the read port may increase the read bit line swing and boost the voltage of the read bit line, so as to enhance the sensing margin and reading stability.

The SRAM cell comprises a first inverter, a second inverter, a first transistor, a second transistor and a third transistor. The first inverter includes a first input node and a first output node, and the second inverter includes a second input node and a second output node, and the second input node is coupled to the first output node, and the second output node is coupled to the first input node. The first transistor is coupled to a write word line, a write bit line and the first output node, and the second transistor is coupled to a complementary write bit line, a write word line and the second output node, and the third transistor is coupled to a read bit line, a read word line and the first input node. Wherein the third transistor has a feature of an asymmetric threshold voltage, so as to expand a read bit line swing and the read bit line swing is expanded through a boosted read bit line.

Wherein, the first transistor includes a gate coupled to the write word line, a drain coupled to the first output node, and a source coupled to the write bit line. The second transistor includes a gate coupled to the write word line, a drain coupled to the second output node, and a source coupled to the complementary write bit line. The third transistor includes a gate coupled to the first input node, a drain coupled to the read word line, and a source coupled to the read bit line.

Wherein, the third transistor has the feature of an asymmetric threshold voltage through a fabrication method or a post fabrication method so as to expand the read bit line swing. In the post fabrication method, a first voltage greater than zero volt is applied to the gate, and a second voltage greater than the first voltage is applied to the drain, and a third voltage equal to or smaller than zero volt is applied to the source, and a fourth voltage smaller than the third voltage is applied to a substrate of the third transistor to form an asymmetric threshold voltage transistor.

It is another objective of the present invention to provide a SRAM cell comprising a latch unit, a write word line and a read word line. The latch unit includes a first output node and a second output node. The write word line is coupled to the first output node and a write bit line through a first transistor, and coupled to the second output node and a complementary write bit line through a second transistor. The read word line is coupled to a first input node and a read bit line of the latch unit through a third transistor to form a read port. Wherein the third transistor has a feature of an asymmetric threshold voltage so as to expand a read bit line swing and the read bit line swing is expanded through a boosted read bit line.

Wherein, a gate of the first transistor is coupled to the write word line, and a drain of the first transistor is coupled to the first output node, and a source of the first transistor is coupled to the write bit line to form a pass gate.

Wherein, a gate of the second transistor is coupled to the write word line, and a drain of the second transistor is coupled to the second output node, and a source of the second transistor is coupled to the complementary write bit line to form a pass gate.

Wherein, a gate of the third transistor is coupled to the first input node, and a drain of the third transistor is coupled to the read word line, and a source of the third transistor is coupled to the read bit line. The third transistor has the feature of an asymmetric threshold voltage through a fabrication method or a post fabrication method so as to expand the read bit line swing. Post fabrication method includes following steps: applying a first voltage greater than zero volt to the gate, applying a second voltage greater than the first voltage to the drain, applying a third voltage equal to or smaller than zero volt to the source, and applying a fourth voltage smaller than the third voltage to a substrate of the third transistor to form an asymmetric threshold voltage transistor.

In summation of the description above, the SRAM cell, of the present invention has one or more of the following advantages:

(1) With the third transistor, the SRAM cell forms a read port transistor, such that the memory cell has a read port capable of reading and writing memory cell independently, so as to eliminate the read disturb of the data voltage and the half-selected disturb of adjacent memory cells when the SRAM cell reads data, to enhance the accuracy and the hit rate of reading data.

(2) The SRAM cell is an independent access memory cell formed by coupling seven transistors, and therefore, compared with the conventional eight-transistor SRAM cell, the seven-transistor SRAM cell can reduce the complexity of the integrated circuit design of the SRAM cell and the unit area of the memory cell.

(3) With the third transistor, the SRAM cell forms a read port transistor, and with the fabrication method or post fabrication method, the read port transistor has a feature of an asymmetric threshold voltage, which can increase the read bit line swing, so as to enhance the sensing margin and read stability.

(4) With the third transistor, the SRAM cell forms a read port transistor, and through boost the voltage of the read bit line, the sensing margin and read stability can be enhanced.

DETAILED DESCRIPTION OF THE PREFERRED EMBODIMENTS

The technical characteristics and effects of the present invention will become apparent by the detailed description of preferred embodiments and related drawings as follows. For simplicity, same numerals are used to represent respective elements in the preferred embodiment and drawings.

Figure 1:
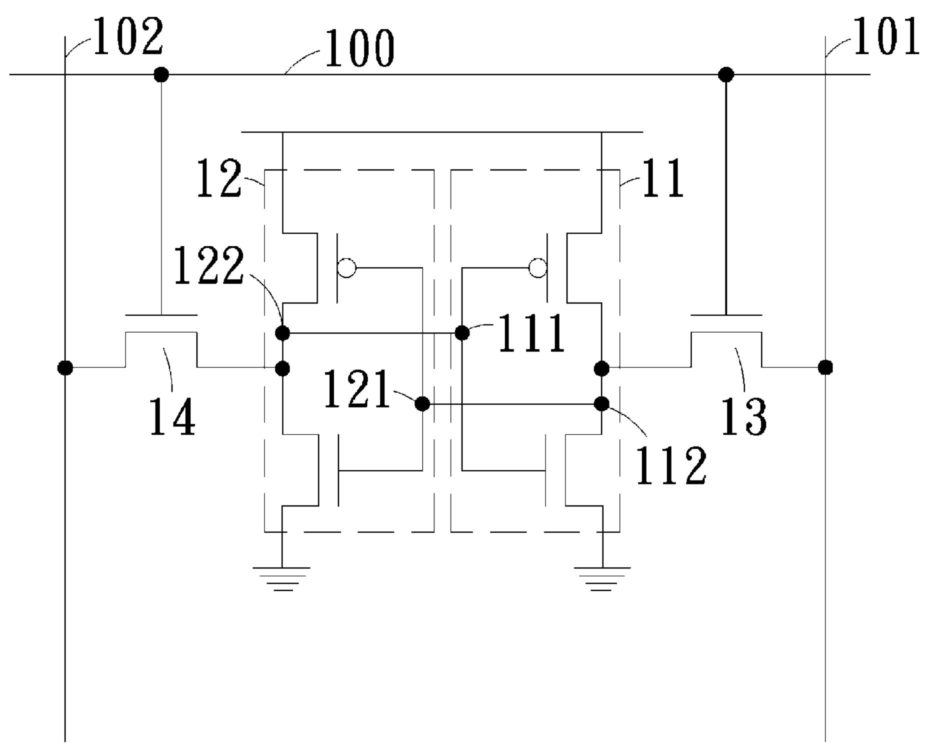
FIG. 1 is a schematic view of a conventional six-transistor SRAM cell.
Figure 2:
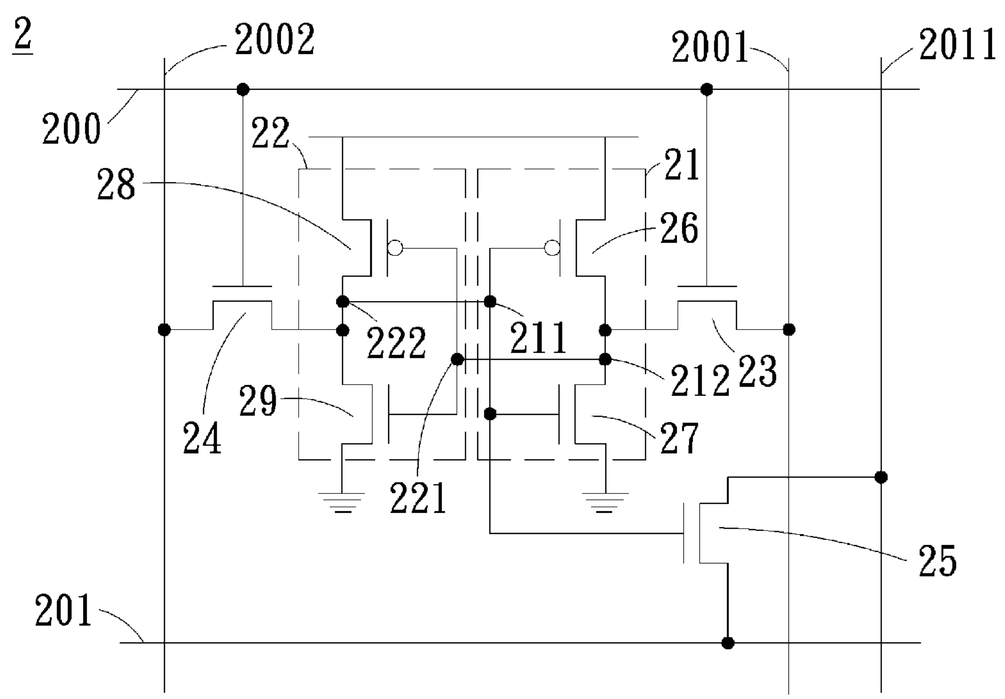
FIG. 2 is a schematic view of a SRAM cell in accordance with a first preferred embodiment of the present invention.

With reference to FIG. 2 for a schematic view of a SRAM cell in accordance with the first preferred embodiment of the present invention, the SRAM cell is a seven-transistor SRAM cell 2 comprising a first inverter 21, a second inverter 22, a first transistor 23, a second transistor 24 and a third transistor 25. The first inverter 21 includes a first input node 211 and a first output node 212, and the second inverter 22 includes a second input node 221 and a second output node 222. The first inverter 21 and the second inverter 22 are cross-coupled. In other words, the first output node 212 is coupled to the second input node 221, and the second output node 222 is coupled to the first input node 211 to form a latch circuit for storing data.

In addition, a gate of the first transistor 23 is coupled to a write word line 200, and a drain of the first transistor 23 is coupled to first output node 212, and a source of the first transistor 23 is coupled to a write bit line 2001. A gate of the second transistor 24 is the same as the gate of the first transistor 23 and coupled to a write word line 200, and a drain of the second transistor 24 is coupled to the second output node 222, and a source of the second transistor 24 is coupled to a complementary write bit line 2002 which is complementary to the write bit line 2001. A gate of the third transistor 25 is coupled to the first input node 211, and a drain of the third transistor 25 is coupled to a read word line 201, and a source of the third transistor 25 is coupled to a read bit line 2011. The third transistor 25 is coupled to the read word line 201 and the read bit line 2011 to form a read port transistor, so that the seven-transistor SRAM cell 2 has a read port. As a result, the seven-transistor SRAM cell 2 can read and write data independently without the need of sharing the word line when accessing the data.

When the seven-transistor SRAM cell 2 is in a hold mode, all of the bit lines including the write bit line 2001, the complementary write bit line 2002 and the read bit line 2011 are charged in advance and maintained at a high voltage level such as the operating voltage higher than the low voltage level of the write word line 200, or a ground or zero-volt voltage, and the read word line 201 is maintained at a high voltage level such as the operating voltage. When the seven-transistor SRAM cell 2 is in a read mode, the voltage of the read word line 201 is released to a low voltage level such as the ground or zero-volt voltage. As a result, the stability of the memory cell is improved during a reading process and the possibility of having a read error or failure can be reduced.

In addition, the first inverter 21 is formed by coupling a fourth transistor 26 and a fifth transistor 27. A gate of the fourth transistor 26 is coupled to a gate of the fifth transistor 27, and a drain of the fourth transistor 26 is coupled to a drain of the fifth transistor 27, and a source of the fourth transistor 26 and a source of the fifth transistor 27 are coupled to a power source and the ground respectively. Similarly, the second inverter 22 is formed by coupling a sixth transistor 28 and a seventh transistor 29. A gate of the sixth transistor 28 is coupled to a gate of the seventh transistor 29, and a drain of the sixth transistor 28 is coupled to a drain of the seventh transistor 29, and a source of the sixth transistor 28 and a source of the seventh transistor 29 are coupled to the power source and the ground respectively.

In the description above, the SRAM cell of the present invention is formed by coupling seven transistors, and each of the seven transistors can be a P-MOS or an N-MOS. For example, the first transistor 23 and the second transistor 24 can be the N-MOS or P-MOS, and the third transistor 25 can be the N-MOS or a low threshold voltage N-MOS. The fourth transistor 26 and fifth transistor 27 of the first inverter 21 can be the P-MOS and the N-MOS. The sixth transistor 28 and seventh transistor 29 of the second inverter 22 can be the P-MOS and the N-MOS respectively. It is noteworthy to point out that persons ordinarily skilled in the art should understand that circuit components such as the seven transistors of the present invention can be the P-MOS or the N-MOS. The SRAM cell in accordance with the aforementioned preferred embodiment of the present invention is provided for illustrating the invention only, but not intended for limiting the scope of the invention. The persons ordinarily skilled in the art should understand that the circuit components such as the seven transistors of the SRAM cell of the present invention can be substituted by a bipolar transistor or a combination of the bipolar transistor and the field-effect transistor without departing from the scope and spirit of the present invention.

Figure 3:
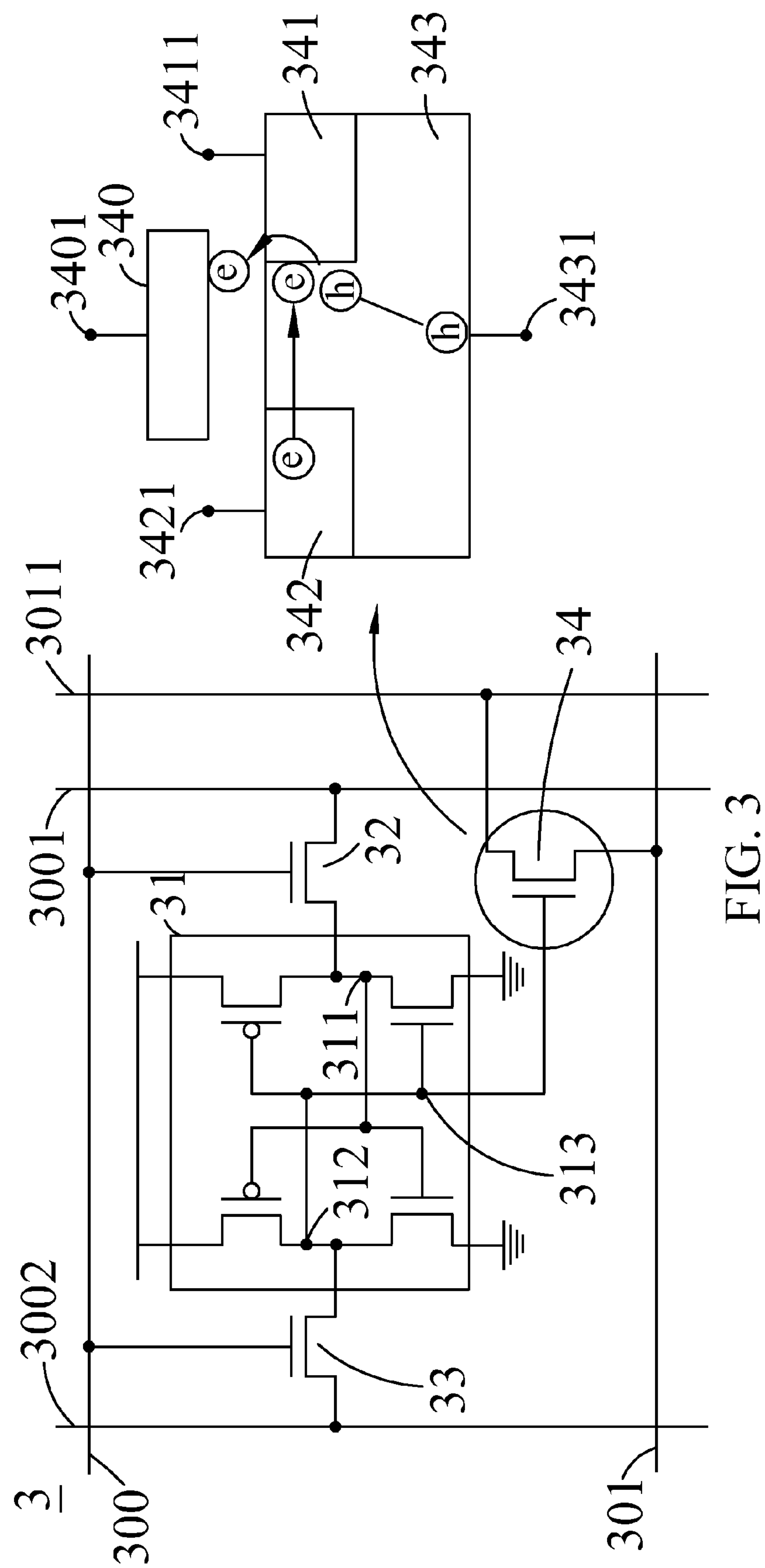
FIG. 3 is a schematic view of a SRAM cell in accordance with a second preferred embodiment of the present invention.

With reference to FIG. 3 for a schematic view of a SRAM cell in accordance with the second preferred embodiment of the present invention, the SRAM cell is a seven-transistor SRAM cell 3 comprising a latch unit 31, a write word line 300 and a read word line 301, which constitute an independent access SRAM cell. The latch unit 31 includes a first output node 311 and a second output node 312. The first output node 311 and the second output node 312 are data access nodes of the seven-transistor SRAM cell 3. The write word line 300 is coupled to the first output node 311 and a write bit line 3001 through a first transistor 32 and coupled to the second output node 312 and a complementary write bit line 3002 through a second transistor 33. In addition, the read word line 301 is coupled to a first input node 313 and a read bit line 3011 of the latch unit 31 through a third transistor 34 to form a read port transistor, such that the seven-transistor SRAM cell 3 has a read port.

A gate of the first transistor 32 is coupled to the write word line 300, and a drain of the first transistor 32 is coupled to the first output node 311, and a source of the first transistor 32 is coupled to the write bit line 3001. A gate of the second transistor 33 is coupled to the write word line 300, and a drain of the second transistor 33 is coupled to the second output node 312, and a source of the second transistor 33 is coupled to the complementary write bit line 3002 to form an access transistor as a pass gate for transmitting data. A gate of the third transistor 34 is coupled to the first input node 313, and a drain of the third transistor 34 is coupled to the read word line 301, and a source of the third transistor 34 is coupled to the read bit line 3011. The read word line 301 operated by logics controls the ON and OFF of the third transistor 34 to form a read port of the memory cell for reading data of the memory cell.

In addition, the latch unit 31 further includes two identical inverters cross-coupled to each other, and each inverter is formed by coupling a P-MOS to an N-MOS, and the first transistor 32, the second transistor 33 and the third transistor 34 are N-MOS acting as circuit components. Therefore, the SRAM cell of the present invention is formed by coupling seven transistors. It is noteworthy to mention that persons ordinarily skilled in the art should understand that the seven-transistor SRAM cell 3 of this preferred embodiment adopting P-MOS or N-MOS as the circuit components of the seven transistors is provided for illustrating the present invention only, but not intended for limiting the scope of the invention.

In this preferred embodiment, the third transistor 34 adjusts the threshold voltage through a fabrication method or a post fabrication method, such that the third transistor 34 has the feature of an asymmetric threshold voltage to form an asymmetric threshold voltage transistor FET. The post fabrication method includes applying a first voltage 3401 greater than zero volt to a gate 340 of the third transistor 34 coupled to the first input node 313, applying a second voltage 3411 greater than the first voltage to a drain 341 of the third transistor 34 coupled to the read bit line 3011, applying a third voltage 3421 equal to or smaller than zero volt to a source 342 of the third transistor 34 coupled to the read word line 301, and applying a fourth voltage 3431 smaller than third voltage to a substrate 343 of the third transistor 34. If the third transistor 34 is an N-MOS, then negatively-charged electrons at the source 342 will be aggregated and accumulated at the gate 340 and the drain 341, and positive charges existing between the source 342 and the drain 341 will leave this passage and the positive charges will be accumulated under the substrate 343. Therefore, the threshold voltage of the drain 341 of the third transistor 43 opposite to the source 342 of the third transistor 34 is slightly greater than the threshold voltage of the 341 opposite to the source 342 of the third transistor 34.

Figure 4:
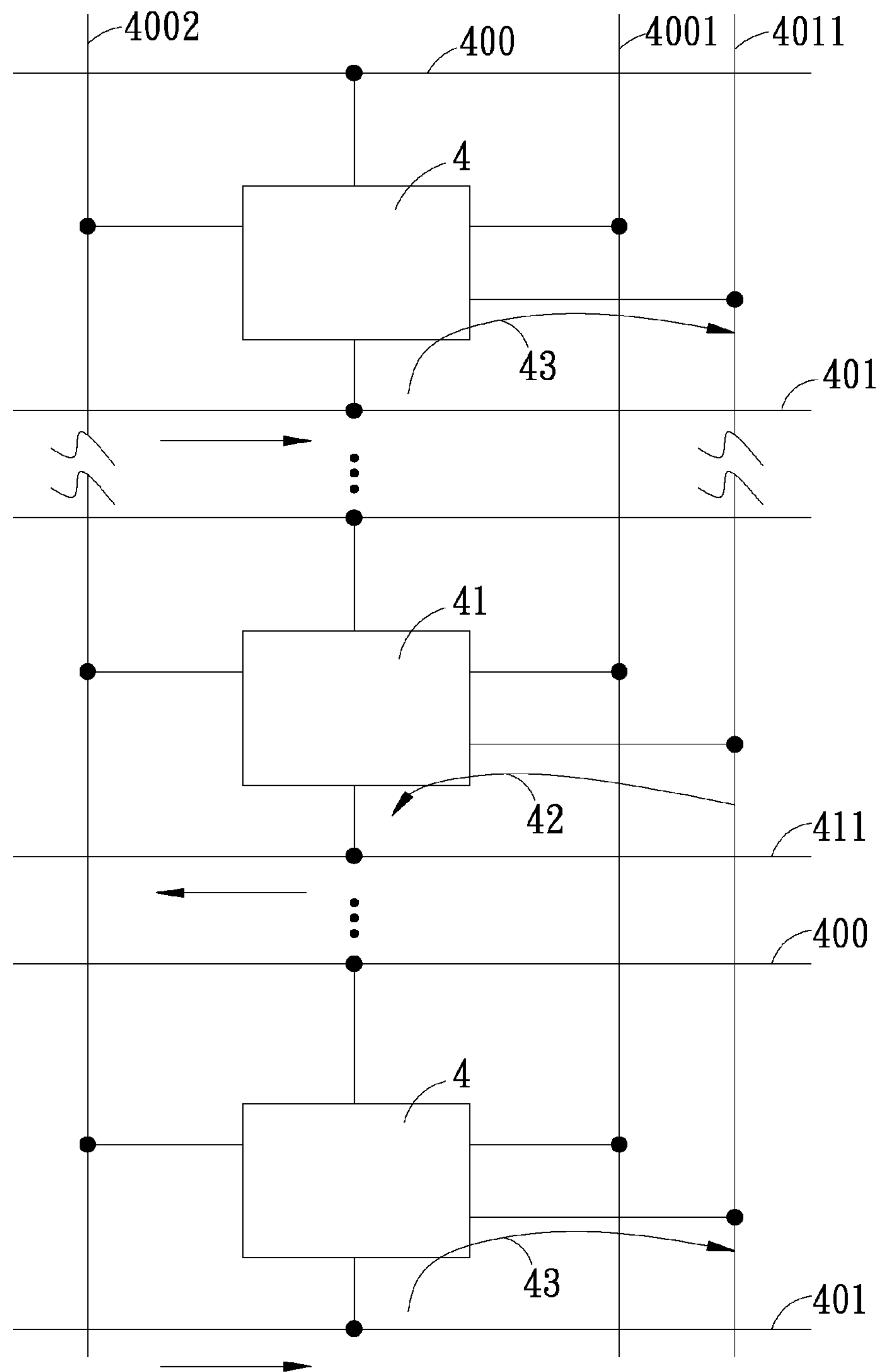
FIG. 4 is a schematic view of a SRAM of the present invention.

With reference to FIG. 4 for a schematic view of a SRAM of the present invention, the SRAM is a seven-transistor SRAM comprising a plurality of seven-transistor SRAM cells 4. In other words, the seven-transistor SRAM includes a plurality of memory cells, a plurality of write word lines 400, a plurality of write bit lines 4001, a plurality of complementary write bit lines 4002, a plurality of read word lines 401 and a plurality of read bit lines 4011. Assumed that the same write bit line 4001 has N memory cells, there will be N write word lines 400 and N read word lines 401 accordingly.

In the N seven-transistor SRAM cell 4, if the Ith memory cell 41 is selected to read memory data, the Ith read word line 411 will be at a low voltage level such as the ground or zero volt, and the read bit line 4011 corresponding to the Ith memory cell 41 will be at a high voltage level such as the operating voltage. In addition, the read port transistor of the Ith memory cell 41 is conducted, and the gate of the third transistor of the Ith memory cell 41 is at a high voltage level. Now, a read current 42 flows from the read bit line 4011 corresponding to the Ith memory cell 41 to the Ith read word line 411, and the voltage level of the read bit line 4011 will drop. On the other hand, before the memory data are read, the read word line 401 of each of the remaining unselected memory cells is at a high voltage level, and the gate of the third transistor is also at a high voltage level. In other words, the read port transistor of each of the unselected memory cells is operated in a cutoff region. During the process of accessing memory data, if the voltage level of the read bit line 4011 of the aforementioned Ith memory cell 41 drops, each of the unselected read port transistor will be weakly turned on to generate a clamping current 43, and the clamping current 43 flows from each unselected read word line 401 to the read bit line 4011 to limit the amplitude and magnitude of the voltage of the read bit line 4011 and cause a reading error or failure.

In this preferred embodiment, the read port transistor of the seven-transistor SRAM cell 4 of the present invention, which is the third transistor, has the feature of the asymmetric threshold voltage, so that the limitation of the clamping current 43 on the amplitude of the voltage of the read bit line 4011 can be reduced to enhance the accuracy and the hit rate of reading data. In addition, when each memory cell reads data, the feature of the asymmetric threshold voltage of the third transistor can be used for boosting the read bit line 4011 in advance to increase the sensing margin, so as to enhance the hit rate and the speed of reading data. In addition, persons ordinarily skilled in the art should understand that the seven-transistor SRAM cell 4 of the present invention can adjust the threshold voltage at the drain and the source of the third transistor through the post fabrication method, such that the feature of the asymmetric threshold voltage of the third transistor can compensate the clamping current. The SRAM cell in accordance with the preferred embodiment of the present invention is provided for illustrating the present invention only, but not intended for limiting the scope of the invention.

In summation of the description above, the SRAM cell of the present invention can be a SRAM cell with a circuit structure based on the six-transistor SRAM cell, plus a serially connected transistor to form an independent access SRAM cell. In addition, with a transistor having a feature of an asymmetric threshold voltage and acting as a read port, the asymmetric threshold voltage of the transistor can be used for compensating the clamping current to enhance the accuracy and speed of reading data.

Therefore, compared with the eight-transistor SRAM cell, the SRAM cell of the present invention has the advantages of smaller unit area, larger read bit line swing, larger sensing margin, better read stability sensing margin, lower operation voltage and lower power consumption.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in forms and details maybe made without departing from the spirit and scope of the present invention as set forth in the following claims.

What is Claimed is:

1. A static random access memory (SRAM) cell, consisting of:

a first inverter, including a first input node and a first output node;

a second inverter, including a second input node and a second output node, and the second input node being coupled to the first output node, and the second output node being coupled to the first input node;

a first transistor, coupled to a write word line, a write bit line and the first output node;

a second transistor, coupled to a complementary write bit line, the write word line and the second output node; and a third transistor, coupled to a read bit line and a read word line and to the first input node or the second input node;

wherein the third transistor has a feature of asymmetric threshold voltage having two different threshold voltages, so as to expand a read bit line swing;

wherein the read bit line swing is expanded through a boosted read bit line;

wherein the first inverter includes a fourth transistor and a fifth transistor, the fourth transistor is coupled to the fifth transistor through the first output node, and the first input node is coupled to a gate electrode of the fourth transistor and a gate electrode of the fifth transistor; and wherein the second inverter includes a sixth transistor and a seventh transistor, the sixth transistor is coupled to the seventh transistor through the second output node, and the second input node is coupled to a gate electrode of the sixth transistor and a gate electrode of the seventh transistor.

2. The SRAM cell of claim 1, wherein the first transistor includes a gate coupled to the write word line, a drain coupled to the first output node, and a source coupled to the write bit line.

3. The SRAM cell of claim 1, wherein the second transistor includes a gate coupled to the write word line, a drain coupled to the second output node, and a source coupled to the complementary write bit line.

4. The SRAM cell of claim 1, wherein the third transistor includes a gate coupled to the first input node, a drain coupled to the read word line, and a source coupled to the read bit line.

5. The SRAM cell of claim 4, wherein the third transistor has the feature of asymmetric threshold voltage through a fabrication method so as to expand the read bit line swing.

6. The SRAM cell of claim 4, wherein the third transistor has the feature of asymmetric threshold voltage through a post fabrication method so as to expand the read bit line swing, and by applying a first voltage greater than zero volt to the gate, applying a second voltage greater than the first voltage to the drain, applying a third voltage equal to or smaller than zero volt to the source, and applying a fourth voltage smaller than the third voltage to a substrate of the third transistor, an asymmetric threshold voltage transistor is formed.

7. The SRAM cell of claim 4, wherein the read bit line coupled to the source of the third transistor expands the read bit line swing through the boosted read bit line.

8. The SRAM cell of claim 4, wherein the third transistor has the feature of asymmetric threshold voltage and expands the read bit line swing through the boosted read bit line.

9. A SRAM cell, consisting of:

a latch unit, including a first inverter including a first input node and a first output node, and a second inverter including a second input node and a second output node, and the second input node being coupled to the first output node, and the second output node being coupled to the first input node;

a write word line, coupled to the first output node and a write bit line through a first transistor and coupled to the second output node and a complementary write bit line through a second transistor; and a read word line, coupled to a first input node or a second input node and to a read bit line of the latch unit through a third transistor to form a read port;

wherein the third transistor has a feature of asymmetric threshold voltage having two different threshold voltages so as to expand a read bit line swing;

wherein the read bit line swing is expanded through a boosted read bit line;

wherein the first inverter includes a fourth transistor and a fifth transistor, the fourth transistor is coupled to the fifth transistor through the first output node, and the first input node is coupled to a gate electrode of the fourth transistor and a gate electrode of the fifth transistor; and wherein the second inverter includes a sixth transistor and a seventh transistor, the sixth transistor is coupled to the seventh transistor through the second output node, and the second input node is coupled to a gate electrode of the sixth transistor and a gate electrode of the seventh transistor.

10. The SRAM cell of claim 9, wherein the first transistor includes a gate coupled to the write word line, a drain coupled to the first output node, and a source coupled to the write bit line to form a pass gate.

11. The SRAM cell of claim 9, wherein the second transistor includes a gate coupled to the write word line, a drain coupled to the second output node, and a source coupled to the complementary write bit line to form a pass gate.

12. The SRAM cell of claim 9, wherein the third transistor includes a gate coupled to the first input node, a drain coupled to the read word line, and a source coupled to the read bit line.

13. The SRAM cell of claim 12, wherein the third transistor has the feature of asymmetric threshold voltage through a fabrication method.

14. The SRAM cell of claim 12, wherein the third transistor has the feature of asymmetric threshold voltage through a post fabrication method so as to expand the read bit line swing, and the post fabrication method includes following steps:

applying a first voltage greater than zero volt to the gate, applying a second voltage greater than the first voltage to the drain, and applying a third voltage equal to or smaller than zero volt to the source; and applying a fourth voltage smaller than the third voltage to a substrate of the third transistor to form an asymmetric threshold voltage transistor.

15. The SRAM cell of claim 12, wherein the third transistor has the feature of asymmetric threshold voltage and expands the read bit line swing through the boosted read bit line.

* * * * *